United States Patent
Liang et al.

(10) Patent No.: US 8,994,226 B2
(45) Date of Patent: Mar. 31, 2015

(54) PASSIVE HARMONIC FILTER FOR POWER DISTRIBUTION SYSTEMS

(75) Inventors: Xiaodong Liang, Edmonton (CA); Obinna Ilochonwu, Edmonton (CA)

(73) Assignee: Schlumberger Technology Corporation, Sugar Land, TX (US)

( * ) Notice: Subject to any disclaimer, the term of this patent is extended or adjusted under 35 U.S.C. 154(b) by 798 days.

(21) Appl. No.: 13/006,753

(22) Filed: Jan. 14, 2011

(65) Prior Publication Data

US 2012/0182089 A1    Jul. 19, 2012

(51) Int. Cl.
*H02J 1/02* (2006.01)
*H02M 1/12* (2006.01)
*H02M 1/14* (2006.01)
*H03H 7/01* (2006.01)

(52) U.S. Cl.
CPC ............ *H03H 7/0153* (2013.01); *H02M 1/126* (2013.01); *H03H 7/1758* (2013.01); *H03H 7/1791* (2013.01); *H03H 2007/013* (2013.01)
USPC ........................................................ 307/105

(58) Field of Classification Search
USPC .......... 307/105; 333/168, 175; 363/39, 45, 47
See application file for complete search history.

(56) References Cited

U.S. PATENT DOCUMENTS

| | | | | |
|---|---|---|---|---|
| 5,387,821 | A * | 2/1995 | Steciuk et al. | 307/105 |
| 5,444,609 | A * | 8/1995 | Swamy et al. | 363/47 |
| 6,009,004 | A | 12/1999 | Swamy | |
| 6,127,743 | A | 10/2000 | Levin et al. | |
| 7,602,136 | B2 * | 10/2009 | Garza | 318/729 |

OTHER PUBLICATIONS

Passive Harmonic Filter Design.*
Passive Harmonic Filter Design Scheme for Subsea Cable Applications with 6-Pulse Variable Frequency Drives.*
Liang (Passive Harmonic Filter Design Scheme for Subsea Cable Applications with 6-Pulse VFDs).*
Elham B. Makram et al, "Harmonic Filter Design Using Actual Recorded Data", IEEE Transactions on Industry Applications, vol. 29, No. 6, Nov./Dec. 1993, pp. 1176-1183.
Robert L. Almonte and A. Wayne Ashley, Harmonics at the Utility Industrial Interface: a Real World Example, IEEE Transactions on Industrial Applications, vol. 31, No. 6, Nov./Dec. 1995, pp. 1419-1426.
J.C. Das, "Passive Filters—Potentialities and Limitations", IEEE Transactions on Industry Applications, vol. 40, No. 1, Jan./Feb. 2004, pp. 232-241.
Maria Emilia De Lima Tostes et al, "Impacts Over the Distribution Grid from the Adoption of Distributed Harmonic Filters on Low-Voltage Customers", IEEE Transactions on Power Delivery, vol. 20, No. 1, Jan. 2005, pp. 384-389.
Xiaodong Liang and Obinna Ilochonwu, "Passive Harmonic Filter Design Scheme for Subsea Cable Application with 6-Pulse Variable Frequency Drives", Proceedings of IEEE 2009 Energy Conversion Congress and Exposition (ECCE), San Jose, California, USA, Sep. 20-24, 2009, pp. 597-603.

* cited by examiner

*Primary Examiner* — Rexford Barnie
*Assistant Examiner* — Rasem Mourad
(74) *Attorney, Agent, or Firm* — Michael Stonebrook

(57) ABSTRACT

A subsea power distribution system includes a three-phase AC power source; multiple variable frequency drives having inputs and outputs, with their inputs connected to the AC power source; an electric motor connected in series to the output of each variable frequency drive; and a passive harmonic filter system having its input connected, in parallel with the variable frequency drives, to the AC power source. The filter system includes multiple harmonic filters, each harmonic filter tuned to a specific harmonic frequency. Each harmonic filter includes a plurality of sub-filters. Each sub-filter includes a reactor connected in series to a main capacitor and one or more detuning capacitors. Each of the multiple harmonic filters is tuned to a different specific harmonic, and includes sub-filters also tuned to the same respective harmonic, and each sub-filter is sized to equally share the kVAR load of its respective harmonic filter.

7 Claims, 5 Drawing Sheets

PASSIVE HARMONIC FILTER FOR POWER DISTRIBUTION SYSTEMS

BACKGROUND OF THE INVENTION

1. Field of the Invention

The present invention relates to filters for filtering out unwanted harmonics in power distribution systems that use variable-frequency drives ("VFDs") for controlling the rotational speed of three-phase alternating current (AC) electric motors by controlling the frequency of the electrical power supplied to the motor.

2. Description of Related Art

Large harmonic distortions cause malfunctions of meters and relays, nuisance tripping of circuit breakers, and equipment overheating. Typical prior art single-tuned passive harmonic filters are illustrated in FIG. 3 of U.S. Pat. No. 5,444,609, which patent is incorporated herein in its entirety by reference. Such filters are tuned to a series of specific harmonic frequencies. A simplified version of FIG. 3 of U.S. Pat. No. 5,444,609 is depicted in FIG. 1 as a passive harmonic filter system 101, which includes harmonic filters 103a, 103b, and 103c, respectively tuned at harmonic frequencies of the 5th, 7th, and 11th harmonics. The passive harmonic filter system 101 also includes circuit breakers or switches 105a, 105b, 105c, and 105d which serve to switch the harmonic filters in or out of the electrical power systems.

The passive harmonic filter system 101 usually has an interlocking control (not shown) among the filters during filter operation. For example, when the filter 103a fails, the interlocking control logic turns off filters 103b and 103c in order to prevent them from overloading, and to prevent a serious resonance condition in the power distribution system. However, this leaves the power distribution system that was being protected by the passive harmonic filter system 101 without any harmonic filtering.

Although there are many designs for passive harmonic filters that are well known in the art, considerable shortcomings remain. What is needed is a passive harmonic filter system that will not fail when interlocking controls shut off individual parts of the filter system.

BRIEF SUMMARY OF THE INVENTION

In one aspect, the present invention provides a passive harmonic filter system having its input connected, in parallel with variable frequency drives, to an AC power source, the filter system comprising multiple harmonic filters, each harmonic filter tuned to a specific harmonic frequency, each harmonic filter comprising at least three sub-filters, each sub-filter comprising: a circuit breaker or switch connected to the AC power source; an inductor or reactor connected to the circuit breaker/switch; and a capacitor connected in series to the inductor/reactor.

In another aspect of the invention, a method for constructing a subsea power distribution system is provided, comprising the steps of: (a) connecting subsea cables to a three-phase AC power source; (b) connecting the inputs of multiple variable frequency drives to the subsea cable; (c) connecting an electric motor in series to the output of each variable frequency drive; and (d) connecting the input of a passive harmonic filter system, in parallel with the variable frequency drives, to the AC power source, the filter system comprising multiple harmonic filters, each harmonic filter tuned to a specific harmonic frequency, each harmonic filter comprising at least three sub-filters, each sub-filter comprising: a circuit breaker/switch connected to the AC power source; an inductor/reactor connected to the circuit breaker/switch; and a capacitor connected in series to the inductor/reactor.

Additional objectives, features, and advantages will be apparent in the written description which follows.

BRIEF DESCRIPTION OF THE DRAWINGS

The novel features characteristic of the invention are set forth in the appended claims. However, the invention itself, as well as a preferred mode of use, and further objectives and advantages thereof, will best be understood by reference to the following detailed description when read in conjunction with the accompanying drawings in which the left-most significant digit in the reference numerals denotes the first figure in which the respective reference numerals appear, wherein:

Figure 1:
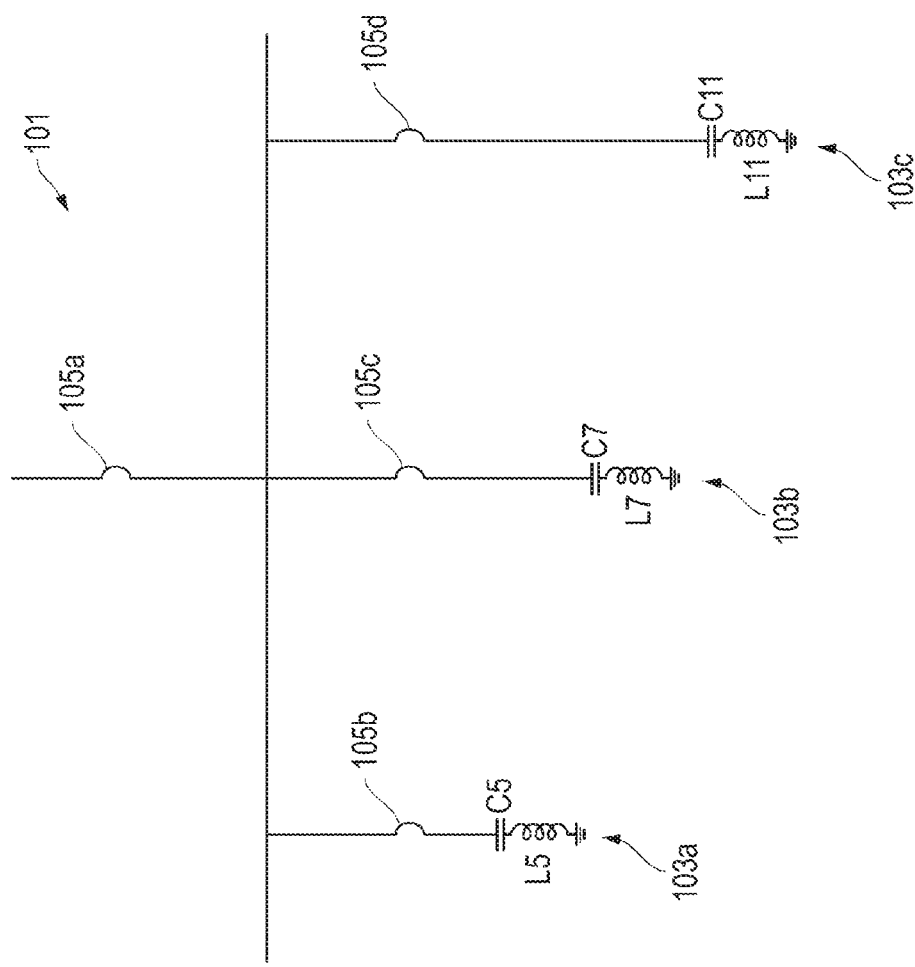
FIG. 1 is a schematic diagram of a prior art passive harmonic filter system which includes a grouping of single-tuned passive harmonic filters.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
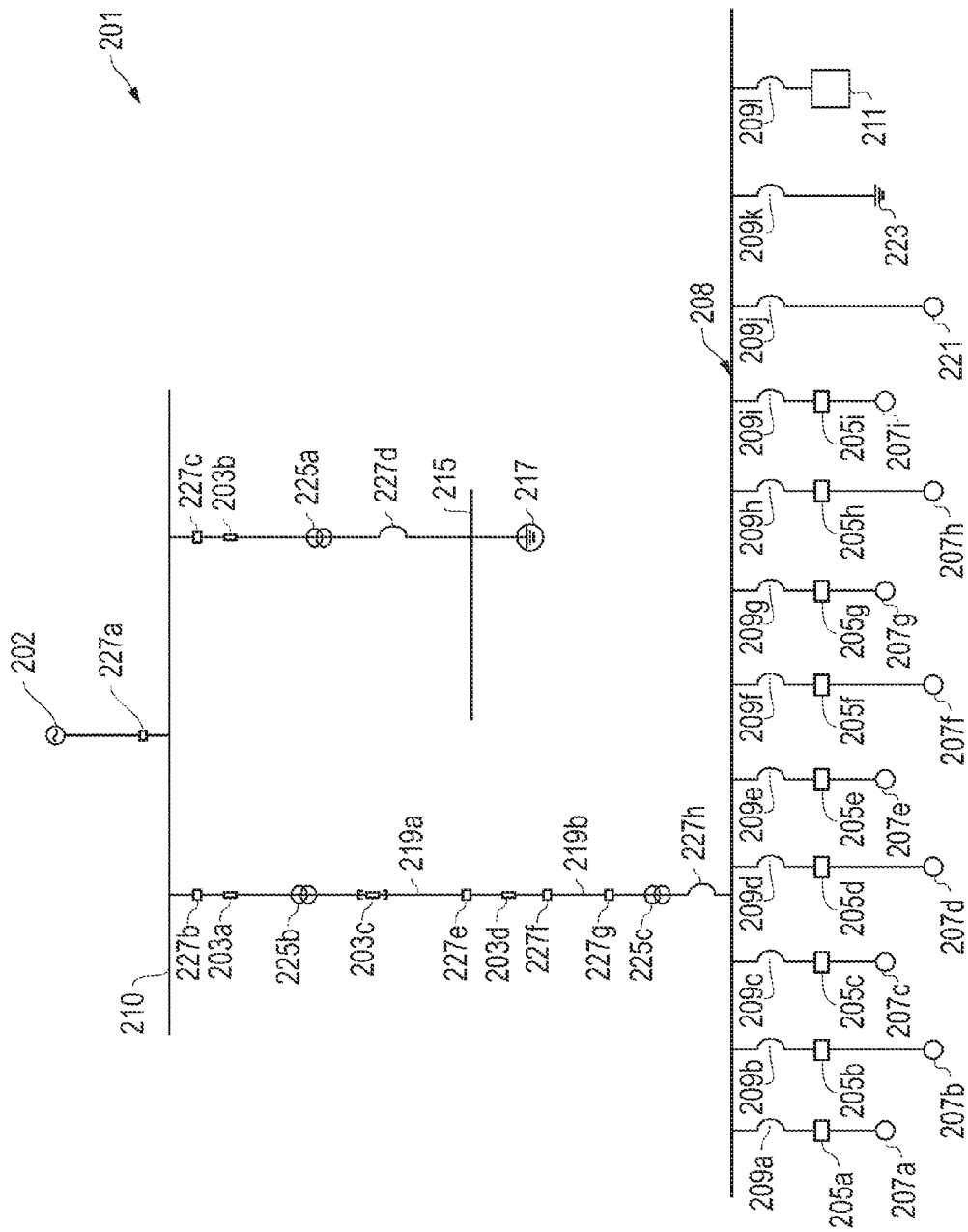
FIG. 2 is a schematic diagram of an offshore power distribution system.

Referring now to FIG. 2, an offshore power distribution system 201 includes a 3.5 MW, 11 kV, 229.6 A power generator 202, and various cable links 203a, 203b, 203c, and 203d. Cable link 203d is a 15 km subsea cable.

The dominant loads on the power distribution system 201 are nine VFDs 205a, 205b, 205c, 205d, 205e, 205f, 205g, 205h, and 205i that are driving 300 horsepower electric motors 207a, 207b, 207c, 207d, 207e, 207f, 207g, 207h, and 207i, which may each drive an electrical submersible pump (ESP). Between each VFD 205 and a 380 V motor switchgear 208 are circuit breakers 209a, 209b, 209c, 209d, 209e, 209f, 209g, 209h, and 209i, which are used for switching the VFD/ESP system in and out of the circuit, and also provide system protection.

Without harmonic filters, the voltage total harmonic distortion (VTHD) is 21.59 percent and the current total harmonic distortion (ITHD) is 46.13 percent at the 11 kV generator switchgear 210 in the power distribution system 201. Such high harmonic distortions are caused by parallel resonance due to the cable link 203d interacting with harmonic currents injected from the input of VFDs 205 into the power distribution system 201. Based on IEEE Standard 519-1992, meters (not shown) in the system 201 could develop significant errors when the harmonic distortions are larger than 20 percent. Also, harmonic distortions of 10-20 percent could cause problems in relay operation. Therefore, in order to operate the power distribution system 201, harmonic filters 211 must be installed and remain in operation at all times. As shown in FIG. 2, the best location to install the harmonic filters 211 in the power distribution system 201 is at the 380 V motor switchgear 208.

The power distribution system 201 includes 380 V utility switchgear 215 for 0.5 MVA utility loads 217, and 22 kV buses 219a and 219b for connecting subsea cable link 203d and supplying power to nine ESP served wells. Other loads connected to the subsea cable link 203d branch are lumped motors 221 and lumped static loads 223. The power distribution system 201 includes three transformers 225a, 225b, and 225c. The transformer 225a is rated at 1 MVA and 11/0.38 kV with 5% impedance Z %. The transformer 225b is rated at 3 MVA and 11/22 kV with 7% impedance Z %. The transformer 225c is rated at 3 MVA and 22/0.38 kV with 7% impedance Z %. As can be seen in FIG. 2, at various places in the power distribution system 201 are circuit breakers (CB1, CB2, etc.) 227. The circuit breakers 227a, 227b, 227c, 227d, 227e, 227f, 227g, and 227h serve to switch the loads in and out of the circuit and also provide protection.

Referring back to the prior art passive harmonic filter system 101 of FIG. 1, suitable sizes for the filters 103a, 103b, and 103c are 300 kVAR, 180 kVAR, and 105 kVAR, respectively. If the passive harmonic filter system 101 is installed in the power distribution system 201 as harmonic filters 203, then when all three filters 103a, 103b, and 103c are operating, the prior art passive harmonic filter system 101 can effectively mitigate harmonics in the power distribution system 201. The VTHD is 1.14 percent, and the ITHD is 1.74 percent at the switchgear 208 in the power distribution system with the passive harmonic filter system 101 installed as harmonic filters 211, compared to VTHD of 21.59 percent and ITHD of 46.13 percent at the switchgear 208 without the passive harmonic filter system 101.

However, when the 5th-harmonic filter 103a fails, the interlocking control will switch the 7th-harmonic filter 103b and the 11th-harmonic filter 103c out to protect the system and to prevent the 7th-harmonic filter 103b and the 11th-harmonic filter 103c from overloading, with the result that the power distribution system 201 will have no operating harmonic filters. The usual interlocking control strategy for the prior art passive harmonic filter system 101 is shown in Table 1.

TABLE 1

| Interlocking Control for Traditional Passive Harmonic Filters | |
| --- | --- |
| Conditions triggering interlocking control | Interlocking Control |
| 5th harmonic filter 103a fails | 7th and 11th harmonic filters 103b and 103c OFF (No filters in the system) |
| 5th and 7th harmonic filters 103a, 103b fail | 11th harmonic filter 103c OFF (No filters in the system) |

TABLE 1-continued

| Interlocking Control for Traditional Passive Harmonic Filters | |
| --- | --- |
| Conditions triggering interlocking control | Interlocking Control |
| 7th harmonic filter 103b fails | 5th harmonic filter 103a ON, 11th harmonic filter 103c OFF |

Figure 3:
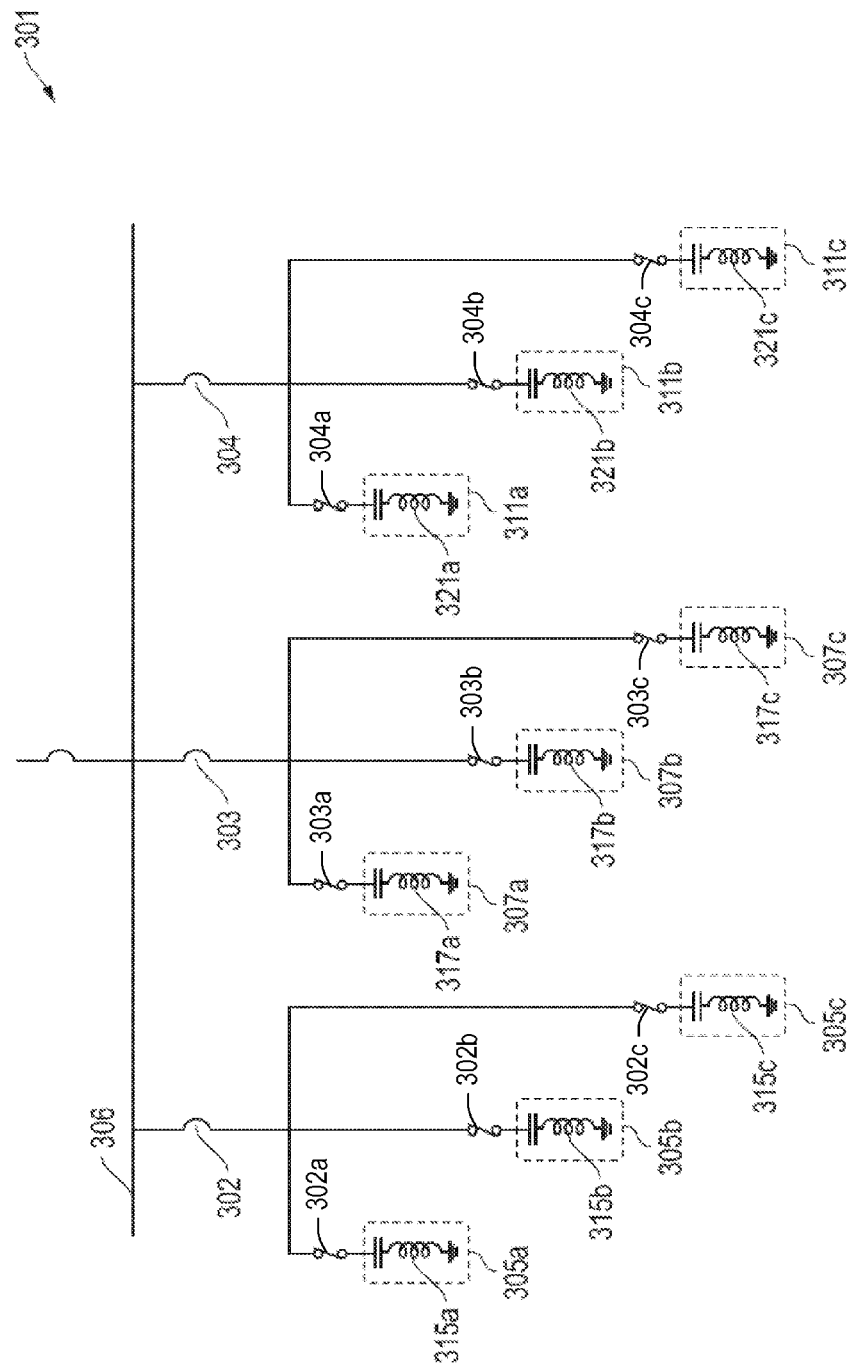
FIG. 3 is a schematic diagram of an illustrative embodiment of the present invention.

Referring now to FIG. 3, one preferred embodiment of the present invention is depicted. A passive harmonic filter system 301 includes multiple sub-filters for each harmonic. Thus, for the 5th-harmonic filter, instead of using a 300 kVAR 5th-harmonic filter 103a as shown in FIG. 1, the inventive passive harmonic filter system 301 uses three 100 kVAR 5th-harmonic sub-filters 305a, 305b, and 305c. Similarly, there are three 60 kVAR 7th-harmonic sub-filters 307a, 307b, and 307c, and three 35 kVAR 11th-harmonic sub-filters 311a, 311b, and 311c. Each 100 kVAR 5th harmonic sub-filter 305 has its own reactor and capacitor, and is tuned at the 5th-harmonic frequency. Each 60 kVAR 7th-harmonic sub-filter 307 has its own reactor and capacitor and is tuned at the 7th-harmonic frequency. Each 35 kVAR 11th-harmonic sub-filter 311 has its own reactor and capacitor and is tuned at the 11th-harmonic frequency. The circuit breakers 302, 303, and 304 connect each set of sub-filters 305, 307, and 311 to a 380 V filter bus 306. FIG. 3 also shows breakers/switches 302a, 302b, 302c, 303a, 303b, 303c, 304a, 304b and 304c.

Referring back to FIG. 2, when the passive harmonic filter system 301 is used in the power distribution system 201 as the harmonic filters 211, if one of the sub-filters 305 fails, the other two sub-filters 305 will still be able to work with the sub-filters 307 and 311 to provide effective harmonic mitigation. For the case when one sub-filter 305 fails, and two sub-filters 305, three sub-filters 307, and three sub-filters 311 remain in operation, the VTHD value for the power distribution system 201 is 1.31 percent, and the ITHD value is 2.38 percent, at the switchgear 208. The simulated harmonic distortions at the switchgear 208, for different scenarios with various sub-filters in operation status, are summarized in Table 2, although Table 2 shows only some of the scenarios.

TABLE 2

| Summary of Simulated Harmonic Distortions | | |
| --- | --- | --- |
| Sub-filters operating status | VTHD, % | ITHD, % |
| All sub-filters out of service | 21.59 | 46.13 |
| All sub-filters in service | 1.14 | 1.74 |
| One sub-filter 305 out of service; two sub-filters 305, and all sub-filters, 307 and 311, in service | 1.31 | 2.38 |
| One sub-filter 307 out of service; three sub-filters 305, two sub-filters 307, and three sub-filters 311 in service | 1.24 | 1.96 |
| One sub-filter 311 out of service; three sub-filters 305, three sub-filters 307, and two sub-filters 311 in service | 1.26 | 1.86 |
| One sub-filter 305, and one sub-filter 307, out of service; two sub-filters 305, two sub-filters 307, and three sub-filters 311 in service | 1.39 | 2.48 |
| One sub-filter 305, and one sub-filter 311, out of service; two sub-filters 305, three sub-filters 307, and two sub-filters 311 in service | 1.41 | 2.43 |
| One sub-filter 307, and one sub-filter 311, out of service; three sub-filters 305, two sub-filters 307, and two sub-filters 311 in service | 1.35 | 2.02 |
| One sub-filter 305, one sub-filter 307, and one sub-filter 311 out of service; two sub-filters 305, two sub-filters 307, and two sub-filters 311 in service | 1.49 | 2.52 |

TABLE 2-continued

Summary of Simulated Harmonic Distortions

| Sub-filters operating status | VTHD, % | ITHD, % |
|---|---|---|
| Two sub-filters 305 out of service; one sub-filter 305, three sub-filters 307, and three sub-filters 311 in service (If the one remaining sub-filter 305 is not overloading) | 2.01 | 4.54 |
| Two sub-filters 307 out of service; three sub-filters 305, one sub-filter 307, and three sub-filters 311 in service (If the one remaining sub-filter 307 is not overloading) | 1.63 | 2.73 |
| Two sub-filters 311 out of service; three sub-filters 305, three sub-filters 307, and one sub-filter 311 in service (If the one remaining sub-filter 311 is not overloading) | 1.50 | 2.07 |

Depending on the harmonic content in the power distribution system 201, when one or two sub-filters fail for each specific filter tuning frequency, the remaining sub-filters are very likely to be overloading. In order to avoid the overloading problem, the conductor size of the reactors 315a-c, 317a-c, and 321a-c for the sub-filters must be over-sized. How much over-sizing for the conductors depends on the chosen number of sub-filters at each tuned harmonic frequency by the design. On the other hand, the rms current flowing through the sub-filters is also restricted by the capacitors. Based on IEEE Standard 18-2002, the maximum continuous operating voltage, current, and kVAR for the capacitors are 110 percent of rated rms voltage and 120 percent of rated peak voltage, 135 percent of nominal rms current based on rated kVAR and rated voltage, and 135 percent of rated kVAR, respectively. For example, for the 100 kVAR 5th sub-filter 305a (rated at 380 V), the nominal rms current is I=Q/($\sqrt{3}$U)=100/(1.732*0.38)=151.93 A, the maximum continuous operating current for the capacitor is equal to 135 percent of the nominal rms current, i.e. 205.11 A. Therefore, the maximum rms current allowed to flow through each sub-filter is determined by the conductor size of the reactor and the current capability of the capacitors.

Figure 4:
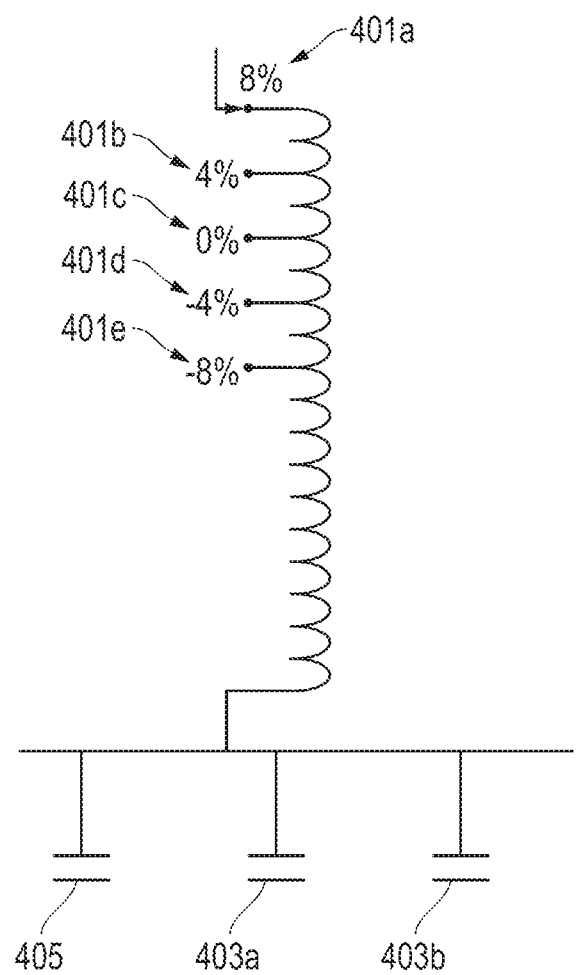
FIG. 4 is a schematic diagram of detuning capacitors which are included in an embodiment of the present invention.

Referring now to FIG. 4, another step to improve the overloading capability for the sub-filters 305, 307, and 311, is to provide taps 401 on the reactors 315, 317, and 321, and adding detuning capacitors 403 to the main capacitor 405 to detune the sub-filters. Table 3 shows the influence on the current flow on the sub-filters 305a, 305b, and 305c by adding detuning capacitors 403a and 403b, and by adding taps 401a, 401b, 401c, 401d, and 401e (401c in the nominal 0 percent tap) on the reactors 315a-c, 317a-c, and 321a-c. By adding the taps 401a-e and the detuning capacitors 403a and 403b on each of the 100 kVAR sub-filters 305a, 305b, and 305c, the current flowing through the sub-filter 305 is reduced by up to 32.6 percent. Further, by properly choosing over-sized conductors for the reactors and combining with the taps 401a-e on the reactors and the detuning capacitors 403a and 403b, the sub-filters for each specific tuning frequency have significantly increased overloading capabilities.

Figure 5:
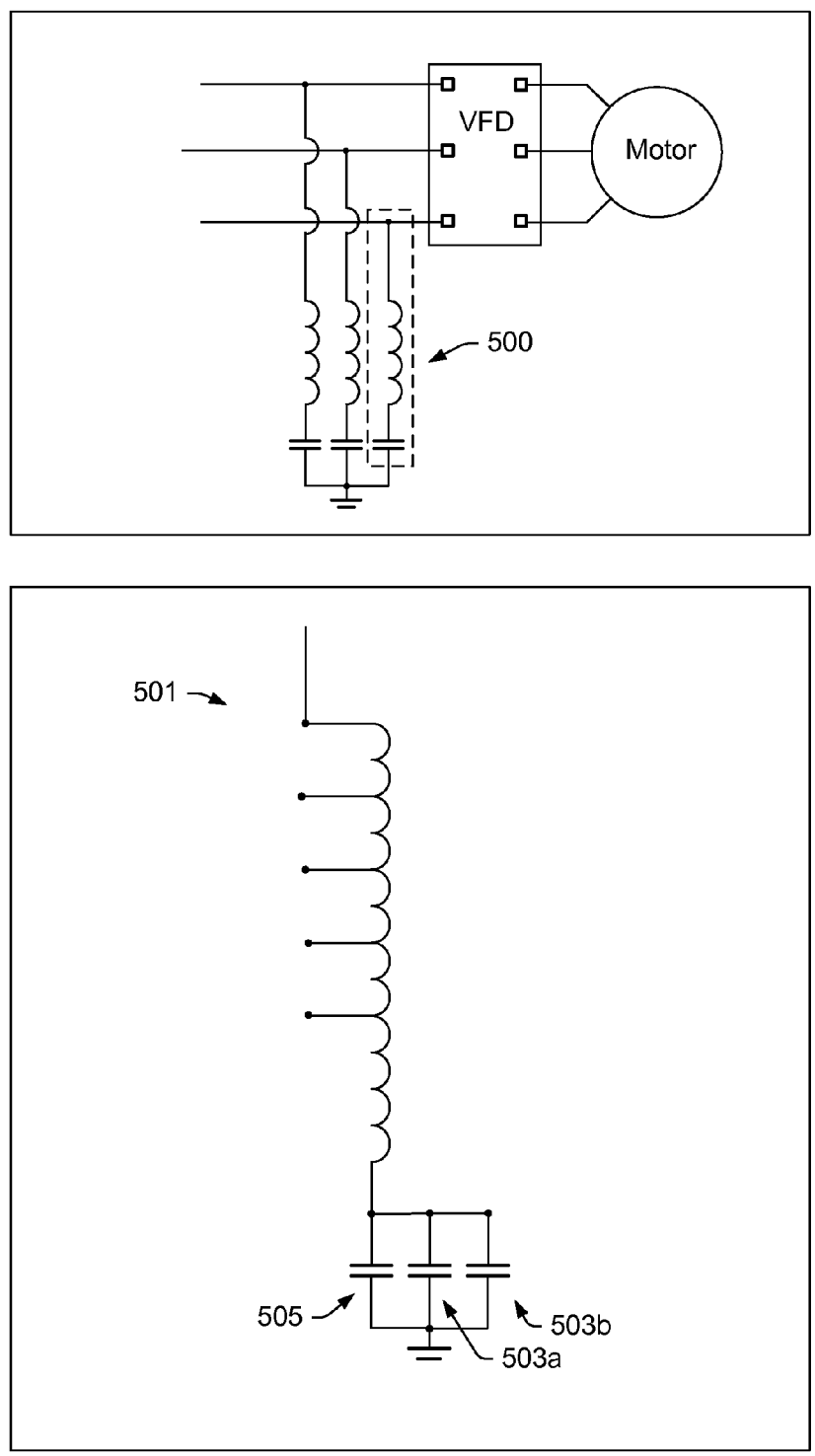
FIG. 5 is a schematic diagram of a portion of FIG. 3 of U.S. Pat. No. 5,444,609 and a schematic diagram of detuning capacitors which are included in an embodiment of the present invention.

FIG. 5 shows a portion 500 of the circuit of FIG. 3 of U.S. Pat. No. 5,444,609 and an example of a portion of a filter. As stated with respect to FIG. 4, by adding the taps 401a-e and the detuning capacitors 403a and 403b on each of the 100 kVAR sub-filters 305a, 305b, and 305c, the current flowing through the sub-filter 305 is reduced by up to 32.6 percent. FIG. 5 shows taps 501, a main capacitor 505 and detuning capacitors 503a and 503b. As shown the capacitors 505, 503a and 503b are in series with the tapped reactor.

TABLE 3

Improvements Using Detuning Capacitors and Taps

| Parameters | | Tuning frequency in harmonic order | Current of sub-filter varied from nominal, percent |
|---|---|---|---|
| Rated voltage, V | 380 | | |
| Rated frequency, Hz | 50 | | |
| Nominal main capacitors, kVAR | 100 | 4.8 | 0 |
| Detuning capacitor, kVAR | 15 | 4.48 | −16.6 |
| | 30 | 4.21 | −24.6 |
| Taps on reactor | +8% | 4.62 | −15.5 |
| | +4% | 4.71 | −8.5 |
| | 0% | 4.80 | 0 |
| | −4% | 4.90 | +10.3 |
| | −8% | 5.00 | +23.0 |
| 15 kVAR detuning capacitor and taps on reactor | +8% | 4.31 | −27.1 |
| | +4% | 4.39 | −22.3 |
| | 0% | 4.48 | −16.6 |
| | −4% | 4.57 | −9.8 |
| | −8% | 4.67 | −1.6 |
| 30 kVAR detuning capacitor and taps on reactor | +8% | 4.05 | −32.6 |
| | +4% | 4.13 | −28.9 |
| | 0% | 4.21 | −24.6 |
| | −4% | 4.30 | −19.6 |
| | −8% | 4.39 | −13.5 |

The interlocking control method for the passive harmonic filter system 301 can be flexible, depending on how many sub-filters are chosen for each tuning frequency. As long as one sub-filter 305, one sub-filter 307, and one sub-filter 311 remain in operation, and these sub-filters have no overloading issue in the power distribution system 201, then the remaining sub-filters will operate without triggering the interlocking control, as shown in Table 4. However, if the power distribution system 201 has a large amount harmonic content which could heavily overload the remaining sub-filters, the interlocking control strategy can be adjusted accordingly.

Although the example given in Table 4 is for six-pulse VFDs, the method of designing harmonic filters, shown in Table 4, can also be used for high-pulse VFD applications such as twelve-pulse VFDs.

TABLE 4

Interlocking Control Strategy

| Conditions Trigging Interlocking Control | Interlocking Control |
|---|---|
| All sub-filters 305 fail | All sub-filters 307 and 311 OFF (no filters in the system) |
| All sub-filters 305, and all sub-filters 307 fail | All sub-filters 311 OFF (no filters in the system) |
| All sub-filters 307 fail | All sub-filters 305 ON, and all sub-filters 311 OFF |

During operation, if one or more sub-filters fail, the remaining sub-filters for a specific tuning frequency will still work and continue to provide harmonic filtering. The chances that all sub-filters must be switched off due to the interlocking control are significantly reduced. The invention offers the flexibility of power factor control, which is particularly helpful for systems with only generators as the power supply.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. Accordingly, the protection sought herein is as set forth in the claims below. Although the present invention is shown in a limited number of forms, it is not limited to just these forms, but is amenable to various changes and modifications.

What is claimed is:

1. A power distribution system comprising:
a three-phase AC power source;
multiple variable frequency drives having inputs and outputs, and having their inputs connected to the AC power source;
an electric motor connected in series to the output of each variable frequency drive; and
a passive harmonic filter system having its input connected, in parallel with the variable frequency drives, to the AC power source, the passive harmonic filter system comprising multiple harmonic filters, each harmonic filter tuned to a specific harmonic frequency, each harmonic filter comprising a plurality of sub-filters, each sub-filter comprising:
 a circuit breaker/switch connected to the AC power source;
 a reactor connected to the circuit breaker/switch; and
 a main capacitor and one or more detuning capacitors connected in series to the reactor such that a current flowing through each sub-filter is reduced by the one or more detuning capacitors.

2. The system of claim 1, wherein each harmonic filter comprises three or more sub-filters.

3. The system of claim 1, wherein the multiple harmonic filters comprise three harmonic filters, a first harmonic filter tuned to the 5th-harmonic, a second harmonic filter tuned to the 7th harmonic, and a third harmonic filter tuned to the 11th harmonic, and wherein each sub-filter of each harmonic filter is tuned to the same harmonic of its respective harmonic filter, and each sub-filter is sized to equally share a kVAR load of its respective harmonic filter.

4. The system of claim 3, wherein each reactor has a plurality of taps located thereon.

5. A method for constructing a subsea power distribution system comprising the steps of:
connecting subsea cables to a three-phase AC power source;
connecting the inputs of multiple variable frequency drives to the AC power source through subsea cables;
connecting an electric motor in series to the output of each variable frequency drive; and
connecting the input of a passive harmonic filter system, in parallel with the variable frequency drives, to the AC power source, the filter system comprising multiple harmonic filters, each harmonic filter tuned to a specific harmonic frequency, each harmonic filter comprising a plurality of sub-filters, each sub-filter comprising:
 a circuit breaker/switch connected to the AC power source;
 a reactor connected to the circuit breaker/switch; and
 a main capacitor and one or more detuning capacitors connected in series to the reactor such that a current flowing through each sub-filter is reduced by the one or more detuning capacitors.

6. The method of claim 5, wherein the multiple harmonic filters comprise three harmonic filters, a first harmonic filter tuned to the 5th-harmonic, a second harmonic filter tuned to the 7th harmonic, and a third harmonic filter tuned to the 11th harmonic, and wherein each sub-filter of each harmonic filter is tuned to the same harmonic of its respective harmonic filter, and each sub-filter is sized to equally share a kVAR load of its respective harmonic filter.

7. The method of claim 6, wherein each reactor has a plurality of taps located thereon.

* * * * *